United States Patent [19]

Vellego et al.

[11] Patent Number: 5,021,397

[45] Date of Patent: Jun. 4, 1991

[54] SYNTHESIS OF CERAMIC SUPERCONDUCTOR CPO FROM XENOTYME

[75] Inventors: Geni Vellego; Cesar A. Filipini, both of Sao Paulo; Pedro I. P. Filho; Sebastiao V. Canevarolo, Jr., both of Sao Carlos; Oswaldo A. Serra, Ribeirao Preto, all of Brazil

[73] Assignees: Pirelli S.A. Cia. Indl. Brasileira; Fundacao Universidade Sao Carlos e Universidade de Sao Paulo, both of Sao Paulo, Brazil

[21] Appl. No.: 289,852

[22] Filed: Dec. 23, 1988

[30] Foreign Application Priority Data

Dec. 23, 1987 [BR] Brazil .............................. PI 8707200

[51] Int. Cl.$^5$ ...................... H01B 12/00; C01F 17/00
[52] U.S. Cl. ...................................... 505/1; 423/21.1; 423/92; 423/263; 423/593; 423/604
[58] Field of Search ............... 75/62, 84, 92; 423/263, 423/21.1, 593, 604, 265; 501/123, 152; 252/521; 502/355; 505/525, 725, 778, 779, 780

[56] References Cited

U.S. PATENT DOCUMENTS

| | | | |
|---|---|---|---|
| 3,925,062 | 12/1975 | Trombe et al. | 423/21.1 |
| 4,201,747 | 5/1980 | Minagawa et al. | 423/21.5 |
| 4,394,353 | 7/1983 | Miyake et al. | 423/21.5 |
| 4,450,142 | 5/1984 | Weterings et al. | 423/321 S |
| 4,461,748 | 7/1984 | Sabot et al. | 423/21.5 |
| 4,514,367 | 4/1985 | Asami et al. | 423/DIG. 14 |
| 4,636,369 | 1/1987 | Fava et al. | 423/21.1 |
| 4,647,438 | 3/1987 | Sabot et al. | 423/21.5 |
| 4,676,957 | 6/1987 | Martin et al. | 423/21.5 |
| 4,726,938 | 2/1988 | Rollat et al. | 423/21.5 |
| 4,758,412 | 7/1988 | Fabre et al. | 423/21.1 |

FOREIGN PATENT DOCUMENTS 58-6947   1/1983  Japan .
61-238930 10/1986  Japan .
61-238931 10/1986  Japan .

OTHER PUBLICATIONS

Gupta et al., Appl. Phys. Lett., vol. 58, No. 11, 1988, "Y, $Ba_2Cu_3O_{7-\delta}$ Thin Films Grown by a Simple Spray Deposition Technique", pp. 163-165.

Hepp et al., MRS vol. 99, 30 Nov. 1987, "Advantages of Barium Peroxide in the Powder Synthesis of Perovskite Superconductors", pp. 615-618.

Kawai et al., Japanese Journal of Applied Physics, vol. 26, No. 10, Oct. 1987, "Formation of Y-Ba-Cu-O Superconducting Film by a Spray Pyrolysis Method", pp. 1740-1742.

Morris et al., MRS Apr. 1987, "Mobile Oxygen and Isotope Effect in the High Temperature Superconductor $YBa_2Cu_3O_{7-\delta}$".

Primary Examiner—Theodore Morry
Assistant Examiner—Ed Squillante
Attorney, Agent, or Firm—Fleit, Jacobson, Cohn, Price, Holman & Stern

[57] ABSTRACT

A process for the preparation of a superconductor of the type $AB_2Cu_3O_{7-x}$, wherein A is a mixture of rare earths, B is an alkaline earth metal and x is less than one, comprising the treatment of xenotime to obtain a rare earths oxide therefrom and mixing the oxide with an alkaline earth metal compound and a copper compound and heat treating the mixture to obtain the superconductor. The treatment of the xenotime comprising melting the xenotime with a 1:1 mixture of $Na_3CO_3$ and $K_2CO_3$, dissolving a solid obtained therefrom in HCl, treating the resulting solution with $NH_4OH$ to precipitate the rare earths, dissolving the precipitate in HCl, treating the resulting solution with $H_2C_2O_4$ to precipitate the rare earths aned calcinating the precipitate to obtain a rare earths oxide.

2 Claims, 1 Drawing Sheet

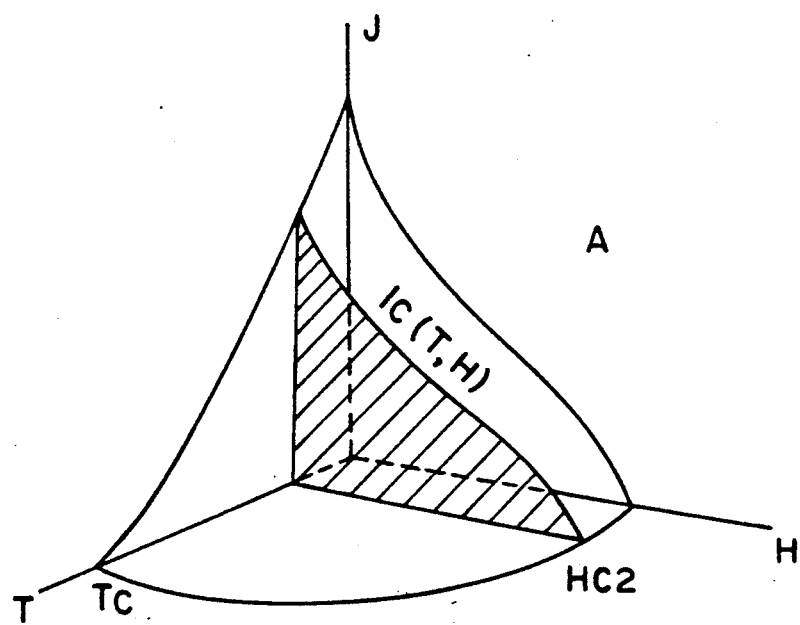

SYNTHESIS OF CERAMIC SUPERCONDUCTOR CPO FROM XENOTYME

BACKGROUND OF THE INVENTION

Superconductive materials are those where the electric resistance falls to zero ($10^{-20}$ Ohm/cm) below a critical temperature, its value depending on the material. The superconductivity is defined only within a critical surface (only figure), its axes being the temperature, the electrical current and the magnetic field. Thus, for a given working temperature there is a defined curve of critical current in function of the magnetic field generated and/or applied to the superconductor.

The main practical superconductor materials are NbTi and $Nb_3SN$. Their working temperature is only 4.2K, which is the boiling temperature of liquid helium. This is the main limitation to large scale application of superconductivity. Superconductors are being used almost exclusively for winding of magnets. Manufactured from wires (NbTi and $Nb_3Sn$) or tapes ($Nb_3Sn$) with high critical current densities (3500 $A/mm^2$ at 5 Tesla for NbTi), they allow the winding of compact magnets for the production of high fields (up to 18 Tesla) in large volumes.

The most popular superconductor magnets are the ones used for the formation of medical images by nuclear magnetic resonance (MRI) and for materials analysis by the same principle (NMR), the magnets for ore separation and research magnets for high fields. Among the latter are the magnets used in large particle accelerators (SSC, HERA, KEK, etc.).

The superconductor magnets are included in the conceptual project of large machines, among them nuclear fusion reactors, energy generators for magneto-hydro-dynamics (MHD) and magnets for energy storage in space stations. Of course, some difficulties in the feasibility of these large machines transcend superconductivity.

The oxide superconductors of high critical temperature were discovered in 1986. These are intermetallic compounds involving copper oxide and rare earths, with perovskite (mica) crystal structure. Their critical temperatures vary from 30K to room temperature and their critical fields are above 60 Tesla. Therefore these materials are considered very promising and may replace with advantages the $Nb_3Sn$ and NbTi in the manufacture of magnets and find other applications not feasible with liquid helium, such as transmission of electricity, for example. These materials are not yet on the market as wires, cables, films, tapes or sheets.

SUMMARY OF THE INVENTION

The present invention relates to the synthesis of superconductors from xenotime, which is an yttrium phosphate mineral common in Brazil containing only rare earth producing good oxide superconductors.

The rare earth oxides represent 45 to 55% of the weight of the mineral. The preferred, but not exclusive destination of these superconductors is the winding of magnets, transmission and distribution of electricity, magnetic shielding, computer applications (hybrid superconductive semiconductors, Josephson joints, transistors, etc.), among other applications.

BRIEF DESCRIPTIONS OF DRAWINGS

The attached FIGURE illustrates the critical surface relative to superconductivity, indicated by (A).

DETAILED DESCRIPTIONS OF THE INVENTION

The following is an example of the above exposure: 100 g of pulverized xenotime (200 mesh) are melted at 1000° C. with 1000 g of a mixture of $Na_2CO_3/K_2CO_3$ in proportion of 1:1. The resulting solid is rinsed with 2 liters of a solution of 1:10 of $Na_2CO_3$, then treated with 200 ml of HCl 1M at 60° C. and then filtered. The residue is discarded. The solution is treated with $NH_4OH$ 3M until all rare earths are precipitated, an excess of $NH_4OH$ is added to separate certain cations which form soluble complexes with $NH_4OH$ ($Zn^{2+}$, $Cu^{2+}$, $Ni^{2+}$, etc.) which may be present. The precipitate is dissolved with HCl 3M and again precipitated with oxalic acid at a temperature between 50° and 60° C. The precipitate is rinsed with diluted oxalic acid and calcinated at 850° C. The mixture of oxides, of a mass between 45 and 55 g contains only the rare earths originally present in the 100 g of xenotime.

In order to obtain 100 g of superconductor, a mixture is prepared from 15 g of rare earth oxides obtained as per above, 53 g of barium carbonate or other alkaline earth and 32 g of copper oxide. A heat treatment is performed for the reaction of the above components at 950° C. for several hours. Then the calcinated material is ground and again heat treated for some hours at below 1000° C. to allow for control by chemical calculation. Then the material is ground again to allow for granulometric control.

What is claimed is:

1. A process for the preparation of a superconductor of the type $AB_2Cu_3O_{7-x}$, where x is less than one, A is a mixture of rare earths and B is an alkaline earth metal, consisting essentially of the steps of:
   (a) melting xenotime with a 1:1 mixture of $Na_2CO_3$ and $K_2CO_3$ cooling the melt to obtain a solid;
   (b) dissolving the solid obtained from step (a) in HCl;
   (c) treating the resulting solution of step (b) with $NH_4OH$ to precipitate the rare earth to form a solution;
   (d) dissolving the resulting rare earth precipitate of step (c) in HCl to form a solution;
   (e) treating the resulting solution of step (d) with oxalicacid ($H_2C_2O_4$) to precipitate the rare earth;
   (f) calcinating the resulting rare earth precipitate of step (e) to obtain rare earth oxide;
   (g) mixing said rare earth oxide with an alkaline earth metal compound and a copper oxide; and
   (h) heat treating the resultant mixture of step (g) to obtain said superconductor.

2. A process for the preparation of a superconductor of the type $AB_2Cu_3O_{7-x}$, where x is less than one, A is a mixture of rare earths and B is an alkaline earth metal, consisting essentially of the steps of:
   (a) melting the xenotime at 1000° C. with a flux of a 1:1 mixture of $Na_2CO_3$ and $K_2CO_3$ cooling the melt to obtain a solid;
   (b) washing the resulting solid of step (a) in a solution of $Na_2CO_3$;
   (c) treating the washed solid of step (b) with HCl to dissolve the solid to form a solution;
   (d) filtering the resulting solution of step (c);

(e) treating filtered solution of step (d) with $NH_4OH$ to precipitate the rare earth;

(f) dissolving the resulting precipitate of step (e) in HCl to form a solution;

(g) treating the resulting solution of step (f) with oxidic acid ($H_2C_2O_4$) at about 50° to 60° C. resulting in a rare earth precipitate;

(h) washing the resulting precipitate of step (g) with $H_2C_2O_4$;

(i) calcinating said precipitate at about 850° C. to obtain a rare earth oxide;

(j) mixing said rare earth oxide with an alkaline earth metal compound and a copper oxide; and (k) heat treating the resultant mixture of step (j) to obtain said superconductor.

* * * * *